(12) United States Patent
Schindler

(10) Patent No.: US 6,708,816 B2
(45) Date of Patent: Mar. 23, 2004

(54) DEVICE FOR HANDLING COMPONENTS

(75) Inventor: Wilhelm Schindler, Regensburg (DE)

(73) Assignee: Infineon Technologies AG, Munich (DE)

( * ) Notice: Subject to any disclaimer, the term of this patent is extended or adjusted under 35 U.S.C. 154(b) by 168 days.

(21) Appl. No.: 10/013,252

(22) Filed: Dec. 10, 2001

(65) Prior Publication Data

US 2002/0083583 A1 Jul. 4, 2002

Related U.S. Application Data

(63) Continuation of application No. PCT/DE01/01131, filed on Mar. 23, 2001.

(30) Foreign Application Priority Data

Apr. 10, 2000 (DE) .......................................... 100 17 742

(51) Int. Cl.[7] .............................................. B65G 17/34
(52) U.S. Cl. ............................. 198/803.15; 198/803.14; 206/716; 206/722
(58) Field of Search ....................... 198/803.14, 803.15; 206/716, 717, 714, 722

(56) References Cited

U.S. PATENT DOCUMENTS

| | | | |
|---|---|---|---|
| 4,754,545 A | | 7/1988 | Elliott |
| 5,131,535 A | * | 7/1992 | O'Connor et al. ........... 206/329 |
| 5,191,693 A | * | 3/1993 | Umetsu ........................ 29/429 |
| 5,427,226 A | * | 6/1995 | Ueda et al. ............... 198/418.6 |
| 5,653,576 A | * | 8/1997 | Pearce ....................... 414/797.7 |
| 5,668,307 A | * | 9/1997 | Wade ........................ 73/40.7 |
| 5,729,963 A | * | 3/1998 | Bird ............................ 53/471 |
| 5,904,253 A | * | 5/1999 | Cerullo et al. .............. 209/128 |
| 5,908,114 A | * | 6/1999 | Althouse et al. ............. 206/714 |
| 6,311,886 B1 | * | 11/2001 | Alexander et al. ............ 226/45 |
| 6,324,752 B1 | * | 12/2001 | Wesseling et al. ............. 29/740 |
| 6,360,866 B1 | * | 3/2002 | Chiba et al. ........... 198/803.15 |
| 6,389,672 B1 | * | 5/2002 | Ishii et al. ..................... 29/430 |
| 6,571,530 B1 | * | 6/2003 | Hikita et al. .................... 53/53 |

FOREIGN PATENT DOCUMENTS

| | | |
|---|---|---|
| DE | 4244640 A1 | 7/1993 |
| DE | 19830562 A1 | 1/2000 |
| EP | 0981152 A1 | 2/2000 |
| JP | 59-167407 | 9/1984 |
| JP | 9-321092 | 12/1997 |

* cited by examiner

*Primary Examiner*—Douglas Hess
(74) *Attorney, Agent, or Firm*—Laurence A. Greenberg; Werner H. Stemer; Ralph E. Locher

(57) ABSTRACT

A device for handling components (i.e. chips) is described. The device utilizes a conveyor belt that has crowns or recesses in a frame configuration into which singled semiconductor chips can be inserted. The conveyor belt has openings or holes between the chip positions that are large enough that the chips can be transported through the openings. It is possible to move the inserted chips by an adapted pick-and-place system, by purely vertical movements, into planes above and below the conveyor belt, in which the chips can be further processed.

5 Claims, 3 Drawing Sheets

DEVICE FOR HANDLING COMPONENTS

CROSS-REFERENCE TO RELATED APPLICATION

This application is a continuation of copending International Application PCT/DE01/01131, filed Mar. 23, 2001, which designated the United States.

BACKGROUND OF THE INVENTION

Field of the Invention

The present invention relates to a device for processing and handling components, particularly semiconductor chips that have been separated from a wafer.

In a terminating (back-end) portion of the fabrication of semiconductor components, separated semiconductor components are transported on a conveyor belt in such a way that back-end fabrication steps can be performed on the chips in succession. Such conveyor belts are manufactured by the company Belt Technologies, for example. Various system parts are utilized to take the chips and feed them to other processing devices, which are usually disposed to the side of the conveyor belt. For instance, gravity handlers, clamping jaws or suction jaws are used for picking up and moving the chips (i.e. handling) (see U.S. Pat. No. 4,754,545, Published, Non-Prosecuted German Patent Applications DE 198 30 562 A1, DE 42 44 640 A1).

SUMMARY OF THE INVENTION

It is accordingly an object of the invention to provide a device for handling components which overcome the above-mentioned disadvantages of the prior art devices of this general type, which is a simplified handling system for components, particularly for fabrication processes for singled semiconductor components.

With the foregoing and other objects in view there is provided, in accordance with the invention, a device for handling components. The device contains a conveyor belt for conveying the components. The conveyor belt has a structure being either a group of crowns or a frame configuration having recesses formed therein. The structure is provided for holding the components on the conveyor belt. The conveyor belt has openings formed therein outside of regions provided for the structure, the openings have lateral dimensions corresponding at least to lateral dimensions of the components. A pick-and-place system for setting the components on the conveyor belt and for taking the components from the conveyor belt, is provided. The pick-and-place system is constructed and disposed such that a component can be picked up from the conveyor belt and moved through one of the openings by the pick-and-place system.

In the inventive device, the conveyor belt is utilized which includes crowns or recesses in a frame configuration into which components, namely singled semiconductor chips, can be inserted, and which also includes openings or holes between the chip positions, which are large enough that the components can be transported through the openings. In this way, it is possible to place the inserted components by use of a suitable pick-and-place system, using purely vertical movements, into planes above and below the conveyor belt, in which the components can be further processed.

In accordance with an added feature of the invention, the pick-and-place system is moved onto the components with an adjustable force.

In accordance with another feature of the invention, the pick-and-place system includes a suction nozzle that is moved vertically in relation to the conveyor belt. The structure and the openings in the conveyor belt are disposed along a direction of a conveyor belt motion.

In accordance with a further feature of the invention, the suction nozzle maintains one position relative to the direction of the conveyor belt motion. Markings are disposed on the conveyor belt and a control device for detecting a position of the markings is provided. The control device has a sensor for aiding in detecting the markings and moves the conveyor belt relative to the suction nozzle according to provided handling steps.

In accordance with a concomitant feature of the invention, the pick-and-place system is a moving coil pick-and-place system.

Other features which are considered as characteristic for the invention are set forth in the appended claims.

Although the invention is illustrated and described herein as embodied in a device for handling components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
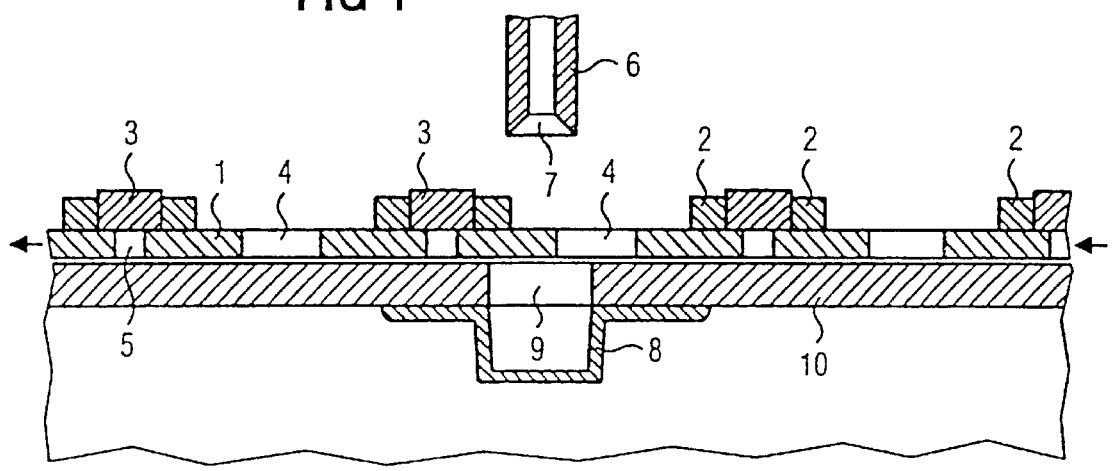
FIG. 1 is a diagrammatic, cross-sectional view of a device according to the invention.

Referring now to the figures of the drawing in detail and first, particularly, to FIG. 1 thereof, there is shown a side-sectional view of an inventive device encompassing a conveyor belt 1. The conveyor belt 1 moves over a fixed base 10 of the device for the handling, or specifically the processing, of components 3. There are also crowns 2 on the conveyor belt 1, which are shaped like a frame or formed by knops in a frame configuration. In principle it is also possible to provide the conveyor belt 1 with recesses into which the components 3, in particular semiconductor chips, are inserted. Upon insertion of the components 3 into the frame-shaped crowns 2, their undersides are accessible through openings 5 in the conveyor belt 1.

Between the regions that are provided for the components 3, openings 4 are provided in the conveyor belt 1, whose lateral dimensions correspond at least to the lateral dimensions of the components 3. The inserted components 3 can thus be taken out of the crowns 2 and moved through the openings 4 in the conveyor belt 1. A pick-and-place system is provided for this, which is represented in FIG. 1 by a suction nozzle 6. The suction nozzle 6 has an intake 7 placed near the component 3 on the conveyor belt 1. The component 3 is sucked in, and can thus be taken off of the conveyor belt 1. After the conveyor belt 1 is advanced, the component 3 can be handed over onto a further belt 8 positioned under the fixed base 10 through one of the openings 4, for instance an opening 9 provided in the fixed base 10 for this purpose.

Figure 2:
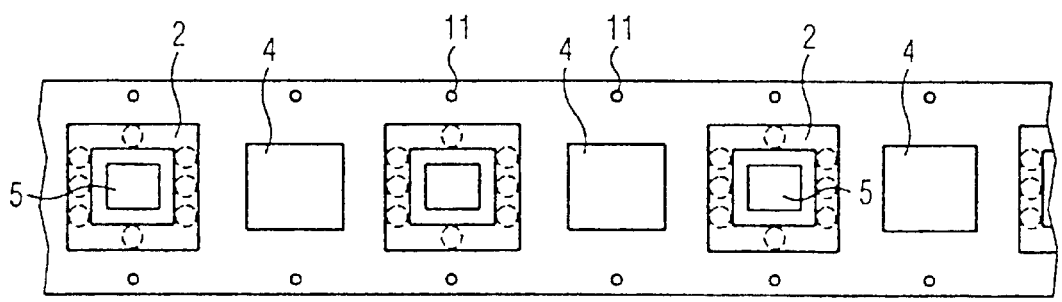
FIG. 2 is a plan view of an inventively utilized conveyor belt.

FIG. 2 is a plan view of the conveyor belt 1. The crowns 2 are represented in solid lines as frames surrounding the respective components 3. Alternatively, circular knops, represented in dotted lines, may be attached on the belt 1, with the components 3 being held on the belt 1 between them. FIG. 2 represents a perspective view without the inserted components 3, so that the openings 5 under the regions in the belt 1 that are provided for the components 3 are visible. The openings 5 can be omitted. Between the devices for holding the components 3, i.e. the crowns 2, the inventively provided openings 4 are situated, whose lateral dimensions are at least as large as those of the components 3. In FIG. 2 there are also markings 11 drawn in at the margins of the conveyor belt 1, these being marks or additional small openings 11 that serve for positioning the belt 1 precisely following the individual forwarding steps. With the conveyor belt 1 which is provided with chip holders as represented in the drawing, the components 3 can be transported securely and rapidly to processing stations. The tops of the components 3 can be processed directly on the conveyor belt 1; the other sides of the components 3 are accessible after a respective component 3 is transported by the inventively constructed device into the planes above and below the belt, respectively.

A pick-and-place device, particularly a processor controlled moving coil pick-and-place system, is utilized for component movement, which expediently occurs only in the vertical direction. This is a matter of a universal high-dynamic system, since only small masses are moved over small distances. When the movement of the component 3 occurs solely in the vertical direction, extremely high processing speeds can be achieved with the inventive device. This is represented more closely in the FIGS. 3a to 3f.

Figure 3A:
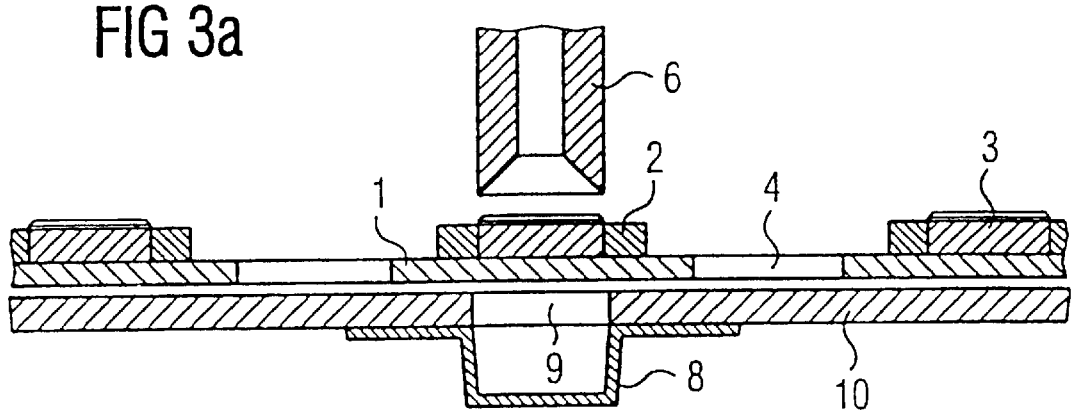
FIGS. 3a to 3f are cross-sectional views showing various method steps in the use of the device.

FIG. 3a represents the perspective according to FIG. 1 in slightly simplified form, whereby the suction nozzle 6 is located directly over the semiconductor chip 3 on the conveyor belt 1. The suction nozzle 6 is expediently moved by the pick-and-place system only vertically, i.e. perpendicular to the direction of motion of the conveyor belt 1, which is represented by the horizontal arrows in FIG. 1. The relative movement between the components 3 and the suction nozzle 6 is accomplished solely by the movement of the conveyor belt 1. In principle, the suction nozzle 6 can be replaced by some other pick-up mechanism. But it is particularly advantageous to utilize a suction mechanism for picking up the components 3 from the belt 1, because of the high processing speeds that can be achieved this way. The parts of the device that serve to move and control the suction nozzle 6 essentially correspond to a known pick-and-place system and have been omitted from the figures for the sake of simplicity.

Figure 3B:
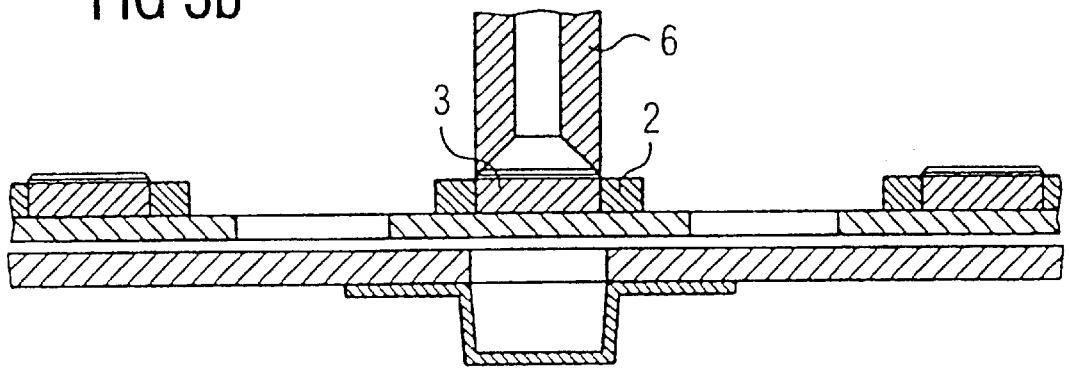
Figure 3C:
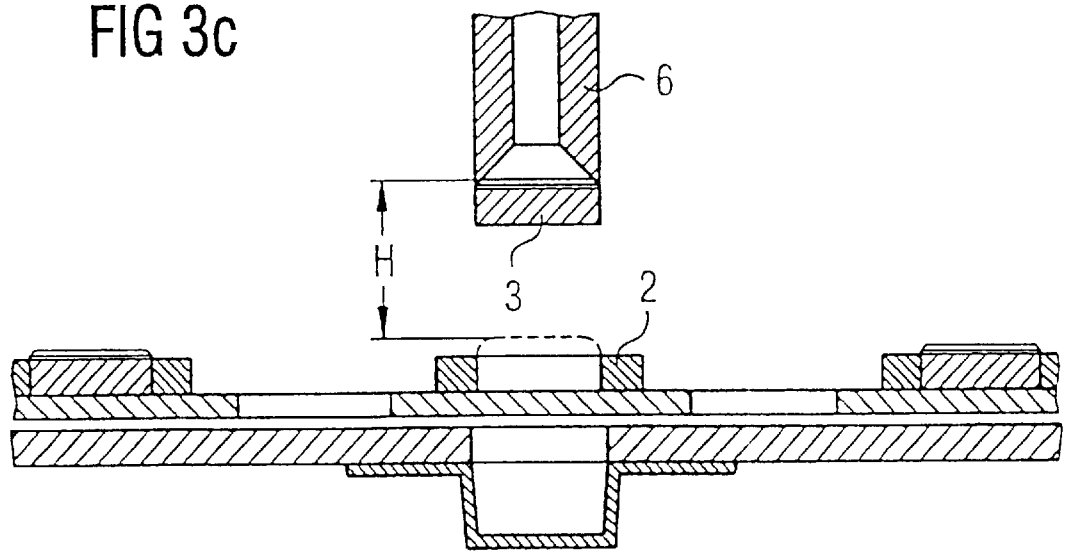

FIG. 3b represents the view shown in FIG. 3a in the step with the suction nozzle 6 placed on the component 3; the hatchings have been omitted for the sake of simplicity. FIG. 3c represents the pick-up of the component 3, which has been lifted a distance H from its original position on the conveyor belt 1.

Figure 3D:
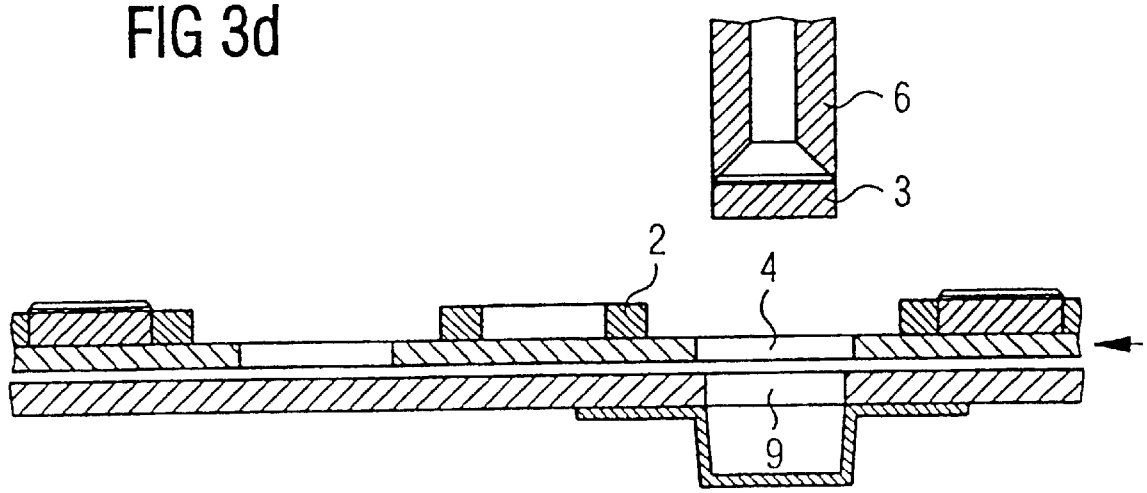
Figure 3E:
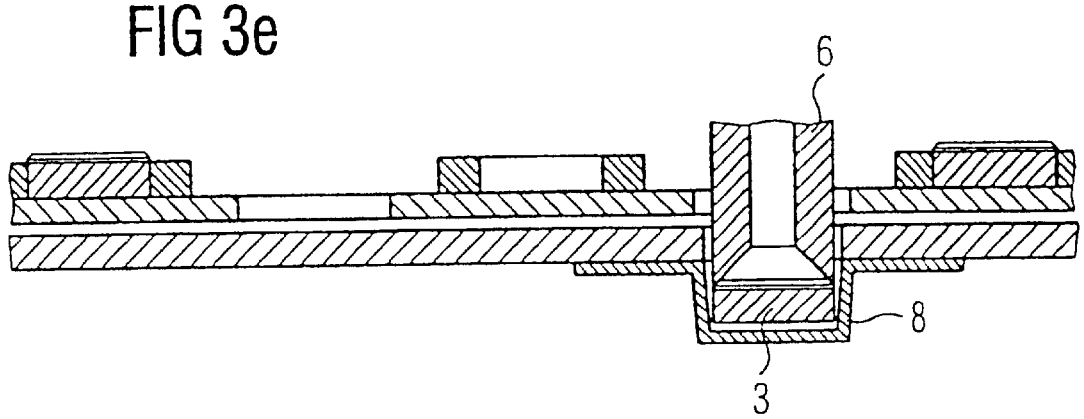
Figure 3F:
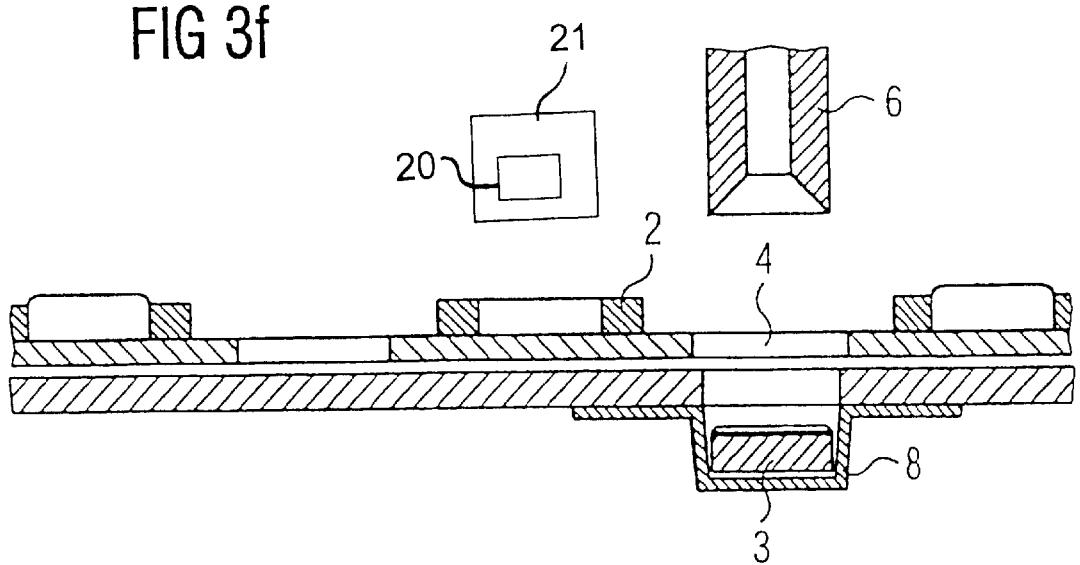

FIG. 3d represents how, when the conveyor belt 1 is advanced, an opening therein reaches a position beneath the suction nozzle 6, which does not move in the longitudinal direction of the conveyor belt 1. In this example, the opening 9 in the fixed base 10 is located beneath the suction nozzle 6, so that, as represented in FIG. 3e, the component 3 can be handed over through the openings 4, 9 into the further belt 8 situated beneath the fixed based 10. The control of air pressure in the suction nozzle 6 then provides that the component 3 becomes detached from the suction nozzle 6, so that the suction nozzle 6 can be moved up again and the conveyor belt 1 can be advanced, as represented in FIG. 3f. The component 3 can then be forwarded in the further belt 8 and further processed if necessary.

In the inventive device, it is sufficient to move the conveyor belt 1 longitudinally and the pick-and-place mechanism only vertically relative thereto. It is thus possible to transport the component 3 into different processing planes. With a built-in controlling or regulating mechanism, it is possible to drastically increase the processing speed, because the movements that are required to transport the components 3 can be performed extremely rapidly in the inventive device. In particular, it is also possible to control the force that is exerted on the component 3 when the pick-and-place mechanism is set down on it. The movement of the conveyor belt 1, which is preferably metal but may also be plastic, is expediently controlled by a control device 21 having at least one sensor 20 that detects the position or motion of the conveyor belt 1. The sensors 20 may work optically given the utilization of reflective markings on the belt or small openings in the belt 1 which are radiated through by a light source from the opposite side.

I claim:

1. A device for handling components, comprising:
   a conveyor belt for conveying the components, said conveyor belt having frame-shaped structures formed thereon or recesses formed therein, said frame-shaped structures or recesses being provided for holding the components, said conveyor belt having openings formed therein outside of regions provided for said frame-shaped structures or recesses, said openings having lateral dimensions corresponding at least to lateral dimensions of the components for the components to be vertically moved therethrough, said frame-shaped structures or recesses being closed from below or provided with openings having smaller lateral dimensions then said openings provided for the components to be vertically moved through; and
   a pick-and-place system for setting the components on said conveyor belt and for taking the components from said conveyor belt, said pick-and-place system constructed and disposed for picking up a component from said conveyor belt and moving the component through one of said openings.

2. The device according to claim 1, wherein said pick-and-place system is moved onto the components with an adjustable force.

3. The device according to claim 1, wherein:
   said pick-and-place system includes a suction nozzle being moved vertically in relation to said conveyor belt; and
   said frame-shaped structures or recesses and said openings in said conveyor belt are disposed along a direction of a conveyor belt motion.

4. The device according to claim 3, including:
   markings disposed on said conveyor belt; and
   a control device for detecting a position of said markings, said control device having a sensor for aiding in detecting said markings and moving said conveyor belt relative to said suction nozzle according to provided handling steps;
   said suction nozzle maintaining one position relative to the direction of the conveyor belt motion.

5. The device according to claim 1, wherein said pick-and-place system is a moving coil pick-and-place system.

* * * * *